(12) United States Patent
Watkins (10) Patent No.: US 8,907,728 B2
(45) Date of Patent: Dec. 9, 2014

(54) HIGH POWER WIDEBAND AMPLIFIER AND METHOD

(75) Inventor: Gavin Watkins, Bristol (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 34 days.

(21) Appl. No.: 13/578,047

(22) PCT Filed: Feb. 9, 2011

(86) PCT No.: PCT/GB2011/000172
§ 371 (c)(1),
(2), (4) Date: Oct. 10, 2012

(87) PCT Pub. No.: WO2011/098759
PCT Pub. Date: Aug. 18, 2011

(65) Prior Publication Data
US 2013/0021103 A1   Jan. 24, 2013

(30) Foreign Application Priority Data

Feb. 9, 2010   (GB) .................................. 1002109.5

(51) Int. Cl.
*H03F 3/68* (2006.01)
*H03F 1/48* (2006.01)
*H03F 3/30* (2006.01)

(52) U.S. Cl.
CPC ................ *H03F 3/3066* (2013.01); *H03F 1/48* (2013.01)
USPC ......................................... 330/295; 330/262

(58) Field of Classification Search
CPC .... H03F 3/68; H03F 2200/432; H03F 1/3252
USPC ......................... 330/262, 295, 124 R, 84, 126
See application file for complete search history.

(56) References Cited

U.S. PATENT DOCUMENTS 3,711,781 A   1/1973   Blomley
4,085,382 A * 4/1978   Barber et al. .................. 330/262

(Continued)

FOREIGN PATENT DOCUMENTS

EP   0 268 159 A2   5/1988
EP   1 503 497   2/2005

(Continued)

OTHER PUBLICATIONS

International Search Report Issued May 17, 2011 in PCT/GB11/000172 Filed Feb. 9, 2011.

(Continued)

*Primary Examiner* — Henry Choe
(74) *Attorney, Agent, or Firm* — Oblon, Spivak, McClelland, Maier & Neustadt, L.L.P.

(57) ABSTRACT

An amplifier including a high supply voltage source and a low supply voltage source and two parallel signal paths. Each signal path is connected to the high and the low supply voltage sources and includes a first amplifier and a second amplifier. The two signal paths are connected to each other only at a common input node and a common output node, so that the respective first amplifiers operate independently of each other. The first amplifiers are configured to convert at least a part of an input voltage signal into a signal current. The signal paths are configured so that the signal current in use drives the respective second amplifier to provide an amplified output current to the common output node.

4 Claims, 5 Drawing Sheets

(56) References Cited

U.S. PATENT DOCUMENTS

| | | | |
|---|---|---|---|
| 4,296,382 A | 10/1981 | Hoover | |
| 4,404,528 A | 9/1983 | Yamaguchi | |
| 4,502,020 A * | 2/1985 | Nelson et al. | 330/265 |
| 4,586,001 A | 4/1986 | Pye | |
| 4,833,423 A | 5/1989 | Molloy | |
| 5,148,120 A * | 9/1992 | Kano et al. | 330/264 |
| 5,907,262 A * | 5/1999 | Graeme et al. | 330/255 |
| 6,380,801 B1 | 4/2002 | McCartney | |
| 6,525,602 B1 | 2/2003 | Tomasini et al. | |
| 6,529,078 B1 | 3/2003 | Gosser et al. | |
| 6,624,671 B2 * | 9/2003 | Fotouhi | 327/112 |
| 7,034,616 B2 * | 4/2006 | Tsuchiya et al. | 330/255 |
| 2005/0024149 A1 | 2/2005 | Escobar-Bowser et al. | |

FOREIGN PATENT DOCUMENTS

| | | |
|---|---|---|
| FR | 2 000 996 A | 9/1969 |
| JP | 56-109010 A | 8/1981 |
| JP | 58-71218 U | 5/1983 |
| JP | 6-21725 A | 1/1994 |
| JP | 6-9224 U | 2/1994 |
| JP | 7-142941 A | 6/1995 |
| JP | 11-88075 A | 3/1999 |
| JP | 2001-160721 A | 6/2001 |
| JP | 2001-308695 A | 11/2001 |
| JP | 2002 311923 | 10/2002 |
| WO | 98 23027 | 5/1998 |

OTHER PUBLICATIONS

Combined Search and Examination Report issued May 18, 2010 in United Kingdom Patent Application No. GB1002109.5.

Office Action issued Oct. 22, 2013 in Japanese Patent Application No. 2012-552457 (with English language translation).

S. Saponara, "Current-feedback architecture for high-slew-rate and low-THD high-end audio amplifier", Electronic Letters, vol. 44, No. 25, Dec. 4, 2008, pp. 1433-1434.

A.S. Sedra, et al., "The current conveyor: history, progress and new results", IEE Proceedings, vol. 137, Pt. G, No. 2, Apr. 1990, pp. 78-87.

* cited by examiner

HIGH POWER WIDEBAND AMPLIFIER AND METHOD

CROSS REFERENCE TO RELATED APPLICATION(S)

This application is based upon and claims the benefit of priority from UK patent application no. 1002109.5, filed 9 Feb. 2010; the entire contents of which is are incorporated herein by reference.

FIELD

Embodiments described herein relate generally to a high power wideband amplifier operating in current mode and to the use of current mirrors in a high power wideband amplifier in current mode.

BACKGROUND

Figure 1:
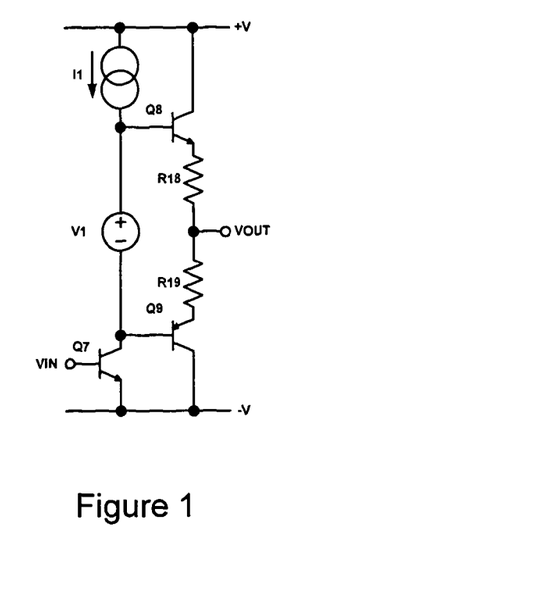
FIG. 1 shows a conventional emitter follower output stage for an amplifier.
Figure 2:
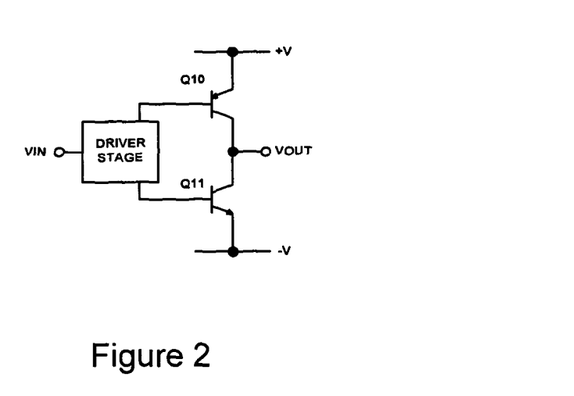
FIG. 2 shows a known rail-to-rail common emitter output stage for an amplifier.

A conventional high power wideband amplifier using low output impedance emitter follower stages is shown in FIG. 1. Some commercially available rail-to-rail devices similar to this design are based on common emitter output stages as shown in FIG. 2. Conventional common emitter follower architectures suffer from high frequency-runaway caused by different signal delays through the output devices and by internal self rectification. Moreover, in devices with low output impedance thermal runaway can occur.

Figure 3:
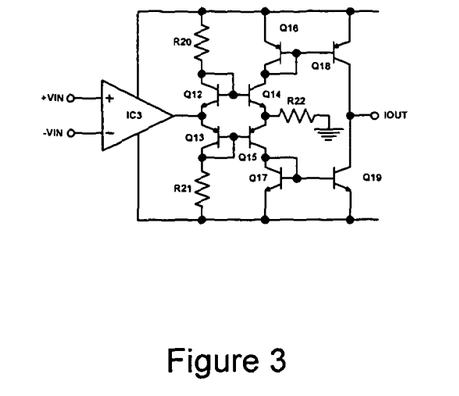
FIG. 3 shows a known class B first generation current conveyor.
Figure 4:
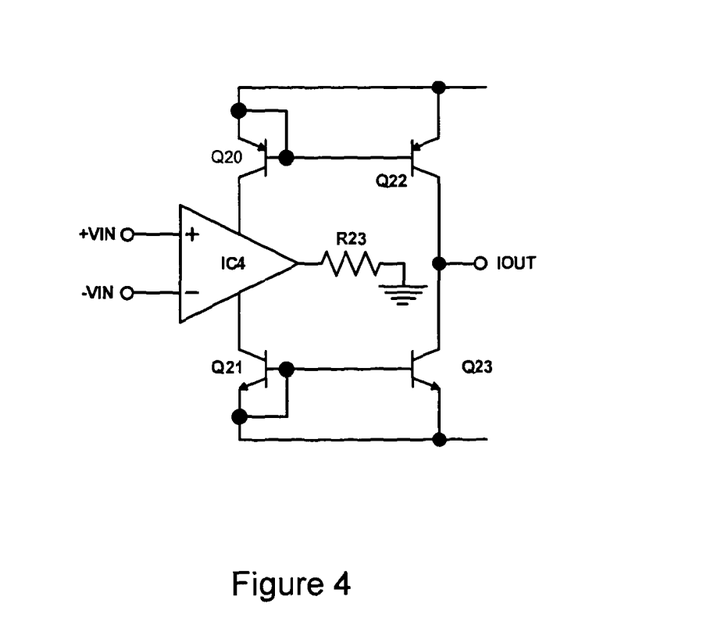
FIG. 4 shows a known class B second generation current conveyor.

FIG. 3 shows a class B current conveyor based amplifier that can achieve high bandwidth. The amplifier shown in this figure preamplifies the input signal using an opamp IC3 and inputs the signal to the node connecting npn transistor Q12 and pnp transistor Q13. Each of transistors Q12 and Q13 is diode connected, so that a positive current excursion of the input signal causes a current to flow through Q12 resistor R20 and a negative current excursion of the input signal causes a current to flow through Q13 and R21. The thus created currents are mirrored by the current mirrors formed by transistors Q12 and Q14 and transistors Q13 and Q15 respectively to flow from the positive supply rail through the transistors Q16 and Q14 and resistor R22 to ground, if the voltage excursion of the input signal is a positive one, or through resistor R22 and transistors Q15 and Q17 if the voltage excursion of the input signal is a negative one. These currents are again mirrored by the current mirrors formed by transistors Q16 and Q18 and transistors Q17 and Q19 respectively to provide the output current IOUT. Both the class B current conveyor architecture shown in FIG. 3 and the class B second generation current conveyor architecture shown in FIG. 4 are bandwidth limited by the switching times of the output devices.

BRIEF DESCRIPTION OF THE DRAWINGS

Embodiments of the present invention will now be described by way of example only and with reference to the accompanying drawings, in which.

DETAILED DESCRIPTION

According to an embodiment there is provided an amplifier comprising a high supply voltage source and a low supply voltage source and two parallel signal paths. Each signal path is connected to the high and the low supply voltage sources and comprises a first amplifier and a second amplifier. The two signal paths are connected to each other only at a common input node and a common output node, so that the respective first amplifiers operate independently of each other. The first amplifiers are arranged to convert at least a part of an input voltage signal into a signal current. The signal paths are arranged so that the signal current in use drives the respective second amplifying means to provide an amplified output current to the common output node. The two signal path may operate in a push-pull arrangement. As they are independent from each other both signal paths can access the entire voltage range supplied by he high and low supply voltage sources. According to an aspect of the present invention there is provided an amplifier comprising a high supply voltage source and a low supply voltage source and two parallel signal paths. Each signal path is connected to the high and the low supply voltage sources and comprises a first amplifier and a second amplifier. The two signal paths are connected to each other only at a common input node and a common output node, so that the respective first amplifiers operate independently of each other. The first amplifiers are arranged to convert at least a part of an input voltage signal into a signal current. The signal paths are arranged so that the signal current in use drives the respective second amplifying means to provide an amplified output current to the common output node. The amplifier of the present invention provides a means of providing an output current with high gain. It is the application of this output current to a load that creates the output voltage. The two signal path may operate in a push-pull arrangement. As they are independent from each other both signal paths can access the entire voltage range supplied by he high and low voltage sources. This allows operating the first amplifier in each signal path at high current gain and increases the dynamic range of these first amplifiers. As the second amplifier acts as a current source the output current is defined by the second amplifier, so that any timing misalignment between the two signal paths, or changes in the properties of the components used in the signal paths, does not cause the drawing of an excess output current and the consequent thermal or frequency runaway. The present invention thus provides a rail-to-rail based amplifier that permits the driving of impedance loads with high gain and at high frequency.

The second amplifier may be a common emitter amplifier that comprises a transistor with a collector connected to the common output node, so that the currents flowing through the second amplifiers correspond to the output current provided by the amplifier. A resistor may be connected between the emitter of the second amplifier and the supply rail to increase the linearity of the second amplifier.

The transistor of the second amplifier may be part of a current mirror. The current mirror may further comprise a diode connected transistor that is connected to the first amplifier so that the signal current flows through it in use. The current mirror thus mirrors the current flowing through the first transistor and drives the second transistor in this manner. The base or gate of the diode connected transistor may in particular be connected to a base or gate of the second transistor. The person skilled in the art will readily understand that in a diode connected transistor the base or gate is connected with a short circuit to the transistor's collector or drain. The emitter of the diode connected transistor may be connected to a voltage supply rail through a resistor.

A useful summary of current conveyor architectures may be found in A. S. Sedra, G. W. Roberts, F. Gohh, "The current conveyor: history, progress and new results", IEE Proceedings, Vol. 2, Pt.G., No. 2, April 1990.

The amplifier may further comprise a biasing means arranged to bias the amplifier into class AB. The biasing means may comprise, for each signal path, a Zener diode connected between the common input node and the first amplifier, so as to, in use, provide a sum voltage of the input voltage and the Zener voltage of the Zener diode at an input of the first amplifier. The cathode of the Zener diode used for biasing the signal path that is operative for amplifying the positive voltage excursions of the input signal may be connected to the signal input node and the anode of this Zener diode may be connected to the base or gate of the transistor in this signal path. The signal path that is operative for amplifying the negative voltage excursions of the input signal may comprise transistors having a polarity that is opposite to the polarity of the transistors of the signal path that is operative for amplifying the positive voltage excursions of the input signal. The anode of the Zener diode used for biasing the signal path that is operative for amplifying the negative voltage excursions of the input signal may be connected to the signal input node and the cathode of this Zener diode may be connected to the base or gate of the transistor in this signal path.

Capacitors may individually be provided in parallel to the Zener diodes.

A resistor may also be connected between the emitter of the first amplifier and a voltage supply rail. In addition a capacitor, or a series connected RC network, may be provided in parallel to this resistor. A series connected RC network, rather than only a capacitor may be used.

The first amplifier may comprise a bipolar transistor with an emitter and a base or field effect transistor with a source and a gate. The emitter/source may be connected to a voltage supply rail. Each signal path may further comprise a diode connected between the base/gate of the transistor and the voltage supply rail, so that a reverse biasing of the transistor causes the diode to conduct.

The amplifier may form part of an envelope modulator in a radiofrequency transmitter of a telecommunications system or in a cellular base station.

According to another embodiment there is provided an envelope modifying radiofrequency transmitter comprising one of the aforesaid amplifiers.

According to another embodiment there is provided a method of reducing frequency runaway in an amplifier, comprising using, in each of two independent signal paths, respective first amplifiers to convert an input voltage signal into a current signal and driving a second amplifier in each signal path with the respective current signal. One of the signal paths is for converting and amplifying positive voltage excursions of the signal and the other signal path is for converting and amplifying negative voltage excursions of the signal.

As the second amplifier acts as a current source the output current is defined by the second amplifier, so that any timing misalignment between the two signal paths, or changes in the properties of the components used in the signal paths, does not cause the drawing of an excess output current and the consequent thermal or frequency runaway. The embodiment thus provides a rail-to-rail based amplifier that permits the driving of impedance loads with high gain and at high frequency.

The second amplifier may be a common emitter amplifier that comprises a transistor with a collector connected to the common output node, so that the currents flowing through the second amplifiers correspond to the output current provided by the amplifier. A resistor may be connected between the emitter of the second amplifier and the supply rail to increase the linearity of the second amplifier.

The transistor of the second amplifier may be part of a current mirror. The current mirror may further comprise a diode connected transistor that is connected to the first amplifier so that the signal current flows through it in use. The current mirror thus mirrors the current flowing through the first transistor and drives the second transistor in this manner. The base or gate of the diode connected transistor may in particular be connected to a base or gate of the second transistor. The person skilled in the art will readily understand that in a diode connected transistor the base or gate is connected with a short circuit to the transistor's collector or drain. The emitter of the diode connected transistor may be connected to a voltage supply rail through a resistor.

A useful summary of current conveyor architectures may be found in A. S. Sedra, G. W. Roberts, F. Gohh, "The current conveyor: history, progress and new results", IEE Proceedings, Vol. 2, Pt.G., No. 2, April 1990.

The amplifier may further comprise a biasing means arranged to bias the amplifier into class AB. The biasing means may comprise, for each signal path, a Zener diode connected between the common input node and the first amplifier, so as to, in use, provide a sum voltage of the input voltage and the Zener voltage of the Zener diode at an input of the first amplifier. The cathode of the Zener diode used for biasing the signal path that is operative for amplifying the positive voltage excursions of the input signal may be connected to the signal input node and the anode of this Zener diode may be connected to the base or gate of the transistor in this signal path. The signal path that is operative for amplifying the negative voltage excursions of the input signal may comprise transistors having a polarity that is opposite to the polarity of the transistors of the signal path that is operative for amplifying the positive voltage excursions of the input signal. The anode of the Zener diode used for biasing the signal path that is operative for amplifying the negative voltage excursions of the input signal may be connected to the signal input node and the cathode of this Zener diode may be connected to the base or gate of the transistor in this signal path.

Capacitors may individually be provided in parallel to the Zener diodes.

A resistor may also be connected between the emitter of the first amplifier and a voltage supply rail to increase the linearity of the first amplifier. In addition a capacitor, or a series connected RC network, may be provided in parallel to this resistor. A series connected RC network, rather than only a capacitor may be used.

The first amplifier may comprise a bipolar transistor with an emitter and a base or field effect transistor with a source and a gate. The emitter/source may be connected to a voltage supply rail. Each signal path may further comprise a diode connected between the base/gate of the transistor and the voltage supply rail, so that a reverse biasing of the transistor causes the diode to conduct.

The amplifier may form part of an envelope modulator in a radiofrequency transmitter of a telecommunications system or in a cellular base station.

According to another embodiment there is provided an envelope modifying radiofrequency transmitter comprising one of the aforesaid amplifiers.

According to another embodiment there is provided a method of reducing frequency runaway in an amplifier, comprising using, in each of two independent signal paths, respective first amplifiers to convert an input voltage signal into a current signal and driving a second amplifier in each signal path with the respective current signal.

One of the signal paths is for converting and amplifying positive voltage excursions of the signal and the other signal path is for converting and amplifying negative voltage excursions of the signal.

Figure 5:
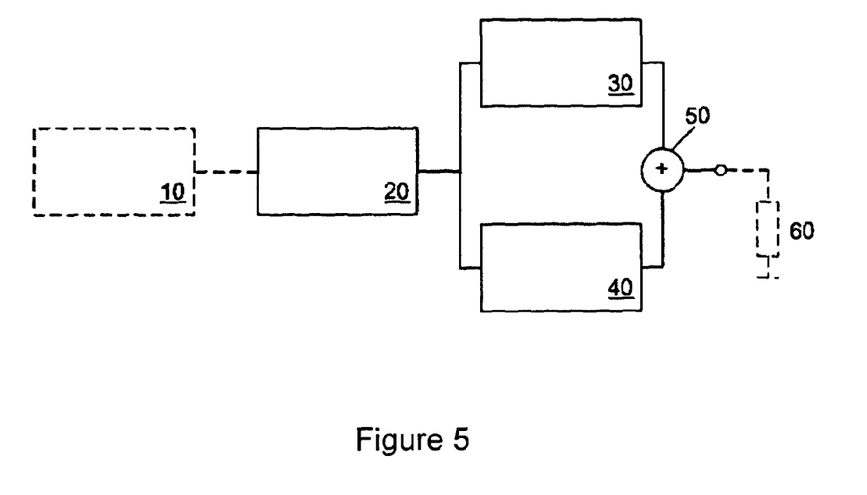
FIG. 5 shows an amplifier according to an embodiment.

One embodiment of an output stage of a wideband high power wideband amplifier is shown in FIG. 5. The amplifier according to the FIG. 5 embodiment may comprise a preamplifier 10 that receives an input signal and amplifies it. The preamplifier 10 outputs a preamplified signal to a biasing arrangement 20. The use of a preamplifier is, however, not essential to the practice of the present invention and the input signal may alternatively be directly input to the biasing arrangement 20. Biasing arrangement 20 provides a bias to the signal in the manner described in more detail below, so that the amplifier is operated in AB mode and outputs a biased signal to the first signal path 30 and the second signal path 40. As can be seen from FIG. 5, the first and second signal paths 30 and 40 are only connected to each other at a common input node (at which the biased input signal is received from the biasing arrangement 20) and a common output node 50, at which the signals generated by the first and the second signal path 30 and 40 are added. It will be appreciated that the biasing arrangement 20 may be omitted from the embodiment if the amplifier is to be operated in class B.

Figure 6:
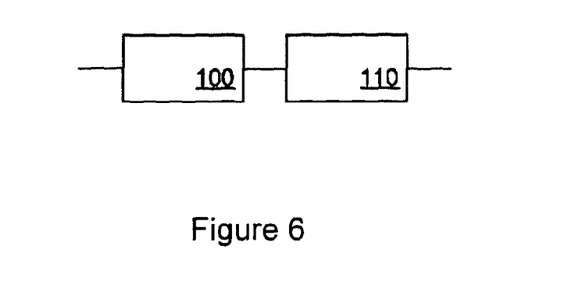
FIG. 6 shows details of a signal path of the amplifier illustrated in FIG. 5.

The first and second signal paths 30 and 40 form current sources that convert an input voltage signal received from the biasing arrangement 20 into output currents in the manner described in more detail with regard to FIG. 6. Reference numeral 60 in FIG. 5 refers to a load through which the summed output current provided at node 50 is applied. The first and second signal paths 30 and 40 operate in a push-pull arrangement. The first signal path 30 is arranged to be operative if the voltage excursions of the input signal received at the biasing arrangement 20 are positive and the second signal path 40 is arranged to be operative if the voltage excursions of the input signal received at the biasing arrangement 20 are negative. If the amplifier operates as intended, one of the two output currents provided by the signal paths 30 and 40 is thus zero, while the other output current reflects the amplified positive or negative voltage excursion of the input signal. However, push-pull arrangements can suffer from differences in the timing of two parallel signal paths. This may lead, in known push-pull arrangements, to excessive current being drawn. The present embodiment avoids this problem by operating the signal paths 30 and 40 as current sources, thereby preventing the drawing of undefined/excessive currents.

FIG. 6 provides an illustration of the components of the signal paths 30/40. Each signal path comprises a first amplifier 100 and a second amplifier 110. The first amplifier 110 converts the input voltage received at the input of the signal path into a signal current that then drives the second amplifier 110. The first amplifier of course also amplifies the input signal. Because the first and second signal paths 30 and 40 do not share any connections other than the common input and output nodes, each of the first amplifiers 100 in the first and second signal paths 30 and 40 can operate independently from the corresponding first amplifier 100 in the other signal path. Consequently, each first amplifier can make full use of the range of upper and lower supply voltages provided within the amplifier, thereby maximising gain and providing the potential to maximise the dynamic range of the first amplifier.

As discussed in the background section above, conventional common emitter follower architectures suffer from high frequency-runaway caused by different signal delays through the output devices and by internal self rectification. It is moreover known that in devices with low output impedance thermal runaway can occur. The inventors have found that a common emitter or current mirror output stage controls output devices better.

Figure 7:
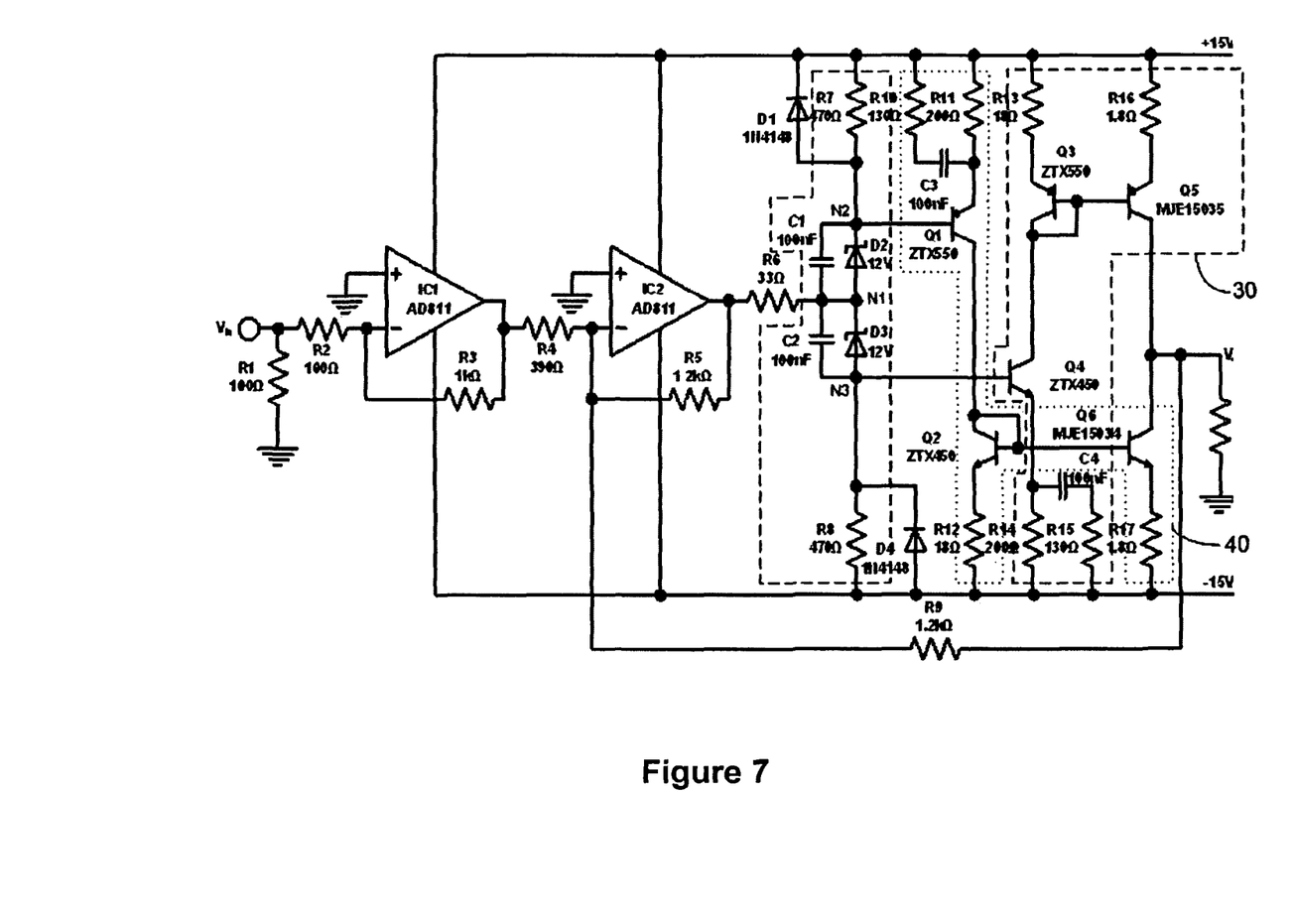
FIG. 7 shows an amplifier with push-pull current mirrors and Zener diode biasing according to an embodiment.

FIG. 7 provides a more detailed illustration of one way of reducing the FIG. 5 arrangement to practice, with the first and second signal paths 30 and 40 and the biasing arrangement 20 being outlined using dashed and dotted lines. Two inverting preamplifier stages are provided by opamps IC1 and IC2. This amplifier provides a means of providing an output current with high gain. It is the application of this output current to a load that creates the output voltage.

The biasing arrangement 20 comprises two parallel networks, each comprising a Zener diode D2/D3 in parallel with a capacitor C1/C2. The biasing arrangement 20 biases the arrangement to operate in class AB, thereby avoiding switching delays that can be experienced in conventional amplifiers operating in class B. The capacitors C1/C2 allow AC components of the input signal can be transmitted to the first amplifier irrespective of any low pass characteristics the Zener diodes D2/D3 may exhibit. Both these parallel networks are connected in series and, at this shared node, to input node N1. Resistors R7 and R8 are further provided in series with the two parallel networks to ensure that a DC current can flow through the Zener diodes D2 and D3 and that consequently the Zener diodes are continuously reverse biased. Zener diode D2 ensures that the voltage at node N2 is $V_{IN}-V_{Zener}$, wherein $V_{IN}$ is the voltage at node N1 and $V_{Zener}$ is the Zener voltage of the Zener Diodes D2 and D3. Zener diode D2 ensures that the voltage at node N2 is $V_{IN}-V_{Zener}$, wherein $V_{IN}$ is the voltage at node N1 and $V_{Zener}$ is the Zener voltage of the Zener Diodes D2 and D3. In the FIG. 7 arrangement $V_{Zener}$ is 12V. Zener diode D3 ensures that the voltage at node N3 is $V_{IN}+V_{Zener}$. Zener diodes can exhibit inductive properties that may attenuate AC components of the input signal $V_{IN}$. Capacitors C1 and C2 allow channelling the AC components of the input signal to nodes N2 and N3.

The Zener diodes D2 and D3 bias the amplifier into AB mode. This biasing is thus performed prior to the amplifying stages provided by the two signal paths 30 and 40, rather than in the output stage, as is the case in some known amplifiers. This is advantageous as the biasing is performed on low power input signals, rather than using higher power output signals that are present in the output stage. The heating effects in the biasing stage of the FIG. 7 embodiment are thus less than the heating effects in such known biasing arrangements. The FIG. 7 embodiment thus exhibits better thermal stability than amplifiers that apply biasing in an output stage. Operating the amplifier stage shown in FIG. 7 in class AB moreover eliminates the limitation of the amplifiers shown in FIGS. 3 and 4 of being bandwidth limited by the switching times of the output devices.

Signal path 30 is operative for positive voltage excursions of the input signal and comprises pnp transistors Q3 and Q5, npn transistor Q4, capacitor C4 and resistors R13 to R16. During a positive voltage excursion the biased potential at node N3 causes the transistor Q4 to conduct according to the node potential. As transistor Q3 is diode connected a current can flow through resistors R13, transistors Q3 and Q4 and through the parallel RRC network connected to the emitter of Q4 and comprising the series network of resistor R17 and capacitor C4 in parallel to resistor R15. Providing the resistors can increase the linearity of the diode connected transistor.

Transistors Q3 and Q5 form a current mirror that mirrors the current flowing through diode connected transistor Q3. The current flowing through transistor Q3 thus drives the current mirror and consequently also the transistor Q5. The performance characteristics of the output transistor Q5 may depend on ambient temperature and/or the input signal. Resistor R16 is provided to reduce the effect of fluctuations in the performance characteristics of transistor Q5.

Signal path 40 is operative for negative voltage excursions of the input signal and comprises transistors that have a polarity opposite to the polarity of the corresponding transistors used in signal path 30. In particular, signal path 40 comprises pnp transistor Q1, npn transistors Q3 and Q6, capacitor C3 and resistors R10 to R12 and R17. As the person skilled in the art will readily appreciate, the components in signal path 40 are arranged to operate in the same manner as those in signal path 30 and a detailed understanding of the operation of the signal path 40 can thus be obtained from the above description relating to the operation of signal path 30.

It will be appreciated from the above, transistors Q1 and 04 convert the input voltage provided by the Zener diodes D2 and D3 respectively into respective collector emitter current, which are then mirrored by the current mirrors formed by transistors Q2 and Q6 and transistors Q3 and Q5 respectively. The combination of transistors Q1, Q2 and Q6 can therefore be considered a current conveyor, as can the combination of transistors Q4, Q3 and Q5.

As discussed above, the two signal paths 30 and 40 operate in a push-pull arrangement, so that when the output transistor Q5 or Q6 of one of the signal paths 30 or 40 provides an output current, the other one of the output transistors Q5 and Q6 does not provide an output current. The output currents provided by Q5 and Q6 are thus provided at different times. Consequently, an output current provided by the transistor Q5 forms the output current that is applied to the load $R_{Load}$ when signal path 30 is active, while an output current provided by the transistor Q6 forms the output current that is applied to the load $R_{Load}$ when signal path 40 is active.

The gain achieved by the first amplifiers Q1 and Q4 respectively can be adjusted through an appropriate choice of resistor R13/R12 and of the impedance of the parallel network formed by resistors R14/R11 and R15/R10 and capacitor C4/C3. The capacitors C3 and C4 are provided to increase the high frequency gain of the first amplifiers Q1 and Q4, with resistors R10/R15 being provided to avoid oscillation of the amplifier. The bandwidth of the amplifier is thus directly influenced by the choice of capacitors C3 and C4. Providing resistors in series with the emitters of the transistors helps increase the linearity of the transistor's operation.

Diodes D1 and D4 are provided in parallel to the base-emitter junctions of transistors Q1 and Q4 respectively, so that the base of each transistor is connected with the part of the diode that has a polarity opposite to the polarity of the base. The second terminals of the diodes D1 and D4 are connected to the positive and negative supply rails respectively. The diodes D1 and D4 therefore conduct when the base emitter junction of the transistors Q1 and Q6 would become reverse biased.

It will be appreciated that the use of bipolar transistors in the FIG. 7 arrangement is not essential to the present invention. It is envisaged that alternatively field effect transistors may be used, for example so that the npn transistors shown in FIG. 7 could be replaced by NMOS FETs and the pnp transistors could be replaced by PMOS FETs.

The conventional current mirror stage shown in FIG. 3 operates in class B if all the transistors are thermally matched. Thermal runaway issues similar to those of the conventional emitter follower output stage can, however, still persist in the FIG. 3 arrangement. By connecting the emitters of transistors Q1 and Q4 of the circuit shown in FIG. 7 to the supply rails (through resistors R11 to R14) improves the linearity of the transistors, and also allows the DC and AC gains to be tailored by appropriately choosing the values of the resistors.

The above described amplifiers overcome the problems of thermal and high frequency runaway, while using a simple circuit layout that is adaptable to other applications requiring high power wideband linear amplifiers. Replacement of the output devices in the amplifier will enable it to be used in DVB and base station applications. The simplicity of the design of the amplifier of the preferred embodiment moreover renders it low-cost. The need for calibration during manufacture is moreover avoided.

Figure 8:
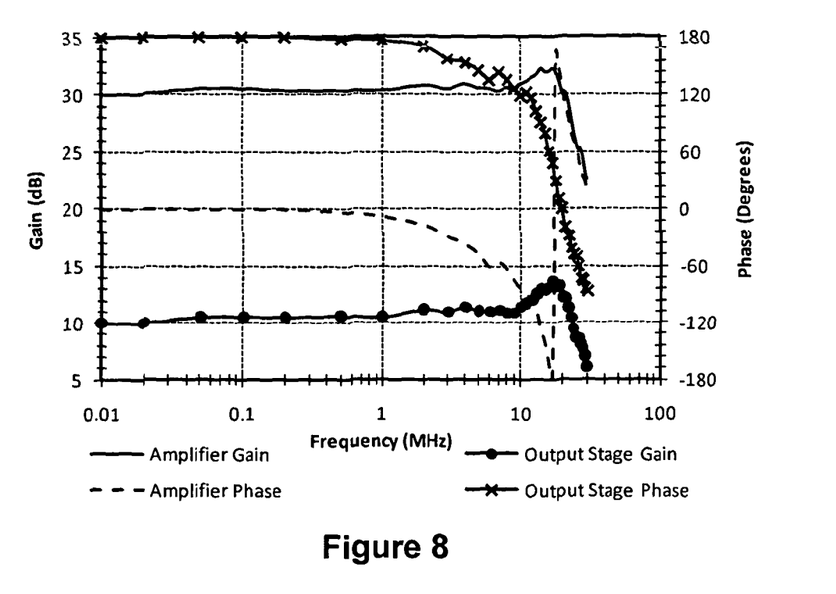
FIG. 8 shows the small signal response of the amplifier shown in FIG. 7, when connected to a 15Ω Load.

FIG. 8 shows the small signal response of the amplifier discussed above with reference to FIG. 7, plotting overall amplifier gain as well as the gain achieved by the output stage formed by the two current mirrors shown in FIG. 7 against operating frequency. As can be seen from this figure, the amplifier has flat gain and phase characteristics over a wide frequency band, illustrating the wide bandwidth of the amplifier shown in FIG. 7.

Figure 9:
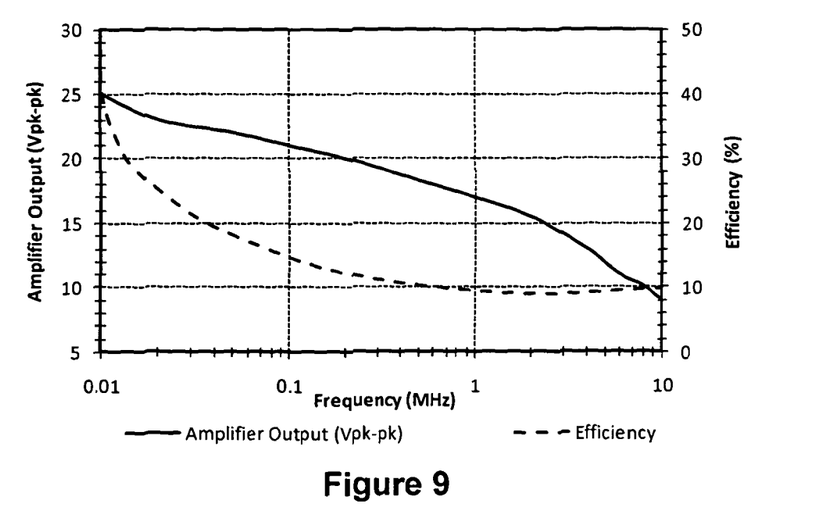
FIG. 9 shows the large signal response of the amplifier shown in FIG. 7, when connected to a 15Ω Load.

FIG. 9 plots the maximum peak to peak output voltage that can be achieved by the amplifier without inducing signal distortion against operating frequency, showing that the amplifier of FIG. 7 has desirable high output power characteristics. Also shown in this figure is the efficiency of the amplifier of FIG. 7. It will be appreciated from FIGS. 8 and 9 that the amplifier shown in FIG. 7 allows retaining efficiency levels comparable to an amplifier operating in class B, while providing good output power levels and high bandwidth.

The use of Zener diodes at an early stage of the circuit biases the amplifier into class AB operation. This allows the linear output stages to operate in a linear mode, whilst still achieving the efficiency benefit of class B operation.

While certain embodiments have been described, the se embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An amplifier comprising:
a first voltage supply configured to supply a first supply voltage;
a second voltage supply configured to supply a second supply voltage, the first supply voltage being higher than the second supply voltage; and
two parallel signal paths, wherein each signal path is connected to the first and the second voltage supplies and comprises a first amplifier stage and a second amplifier stage, wherein the two signal paths are connected to each other only at a common input node and a common output node, and wherein each signal path is individually connected to the first and second voltage supplies, wherein the first amplifier stages are configured to convert at least a part of an input voltage signal into a signal current, and the signal paths are configured so that the signal current in use drives the respective second amplifier stages to provide an amplified output current to the common output nod, the amplifier further comprising a biasing network configured to bias the amplifier into AB mode, the biasing network comprising, for each signal path, a Zener diode connected between the common input node and the first amplifier stage, so as to in use provide a sum voltage of the input voltage and the Zener voltage of the Zener diode at an input of the first amplifier stage, a capacitor being arranged in parallel with the Zener diode;

wherein the first amplifier stage comprises a transistor with an emitter or source and a base or gate, the emitter or source being connected to a voltage supply rail, wherein each signal path further comprises a diode connected between the base or gate of the transistor and the voltage supply rail, wherein a reverse biasing of the transistor causes the diode to conduct.

2. An amplifier according to claim 1, wherein each second amplifier stage is a common emitter amplifier stage that comprises a transistor, wherein the transistor is part of a current mirror, and wherein the current mirror further comprises a diode connected transistor that is connected to the first amplifier stage so that the signal current flows through it in use.

3. An envelope modifying radiofrequency transmitter or cellular base station comprising an amplifier according to claim 1.

4. A method of reducing frequency runaway in an amplifier, comprising:

using, in each of two independent signal paths of the amplifier, a biasing network comprising a Zener diode in parallel with a capacitor and respective first amplifier stages to convert at least a part of an input voltage signal into a current signal and driving a second amplifier stage with the current signal, wherein a first signal path is for converting and amplifying positive voltage excursions of the input voltage signal and a second signal path is for converting and amplifying negative voltage excursions of the input voltage signal, wherein the Zener diodes are connected between an input node of the amplifier and the first amplifier stages; and wherein the first amplifier stage comprises transistor with an emitter or source and a base or gate, the emitter or source being connected to a voltage supply rail, wherein each signal path further comprises a diode connected between the base or gate of the transistor and the voltage supply rail, wherein a reverse biasing of the transistor causes the diode to conduct.

\* \* \* \* \*